United States Patent
Bhattacharjee et al.

(10) Patent No.: US 10,411,695 B2
(45) Date of Patent: Sep. 10, 2019

(54) PROGRAMMABLE TUNNEL THERMIONIC MODE TRANSISTOR

(71) Applicant: Indian Institute of Science, Bangalore, Karnataka (IN)

(72) Inventors: Shubhadeep Bhattacharjee, Bangalore (IN); Kolla Lakshmi Ganapathi, Bangalore (IN); Sangeneni Mohan, Bangalore (IN); Navakanta Bhat, Bangalore (IN)

(73) Assignee: Indian Institute of Science, Bangalore (IN)

(*) Notice: Subject to any disclaimer, the term of this patent is extended or adjusted under 35 U.S.C. 154(b) by 0 days.

(21) Appl. No.: 15/990,034

(22) Filed: May 25, 2018

(65) Prior Publication Data

US 2018/0343006 A1    Nov. 29, 2018

(30) Foreign Application Priority Data

May 26, 2017 (IN) .............................. 201741018661

(51) Int. Cl.

| | |
|---|---|
| *H03K 17/687* | (2006.01) |
| *H01L 29/78* | (2006.01) |
| *H01L 29/47* | (2006.01) |
| *H01L 29/739* | (2006.01) |
| *H01L 29/772* | (2006.01) |
| *H01L 29/51* | (2006.01) |
| *H01L 29/24* | (2006.01) |
| *H01L 29/66* | (2006.01) |

(Continued)

(52) U.S. Cl.
CPC .......... *H03K 17/687* (2013.01); *H01L 29/24* (2013.01); *H01L 29/47* (2013.01); *H01L 29/495* (2013.01); *H01L 29/517* (2013.01); *H01L 29/66969* (2013.01); *H01L 29/7391* (2013.01); *H01L 29/7722* (2013.01); *H01L 29/786* (2013.01); *H01L 29/7831* (2013.01); *H01L 29/7839* (2013.01); *H03K 2017/6878* (2013.01); *H03K 2217/0018* (2013.01)

(58) Field of Classification Search
None
See application file for complete search history.

(56) References Cited

U.S. PATENT DOCUMENTS

| | | | | |
|---|---|---|---|---|
| 9,214,539 B2* | 12/2015 | Chiu | .................. | H01L 29/7787 |
| 9,647,098 B2* | 5/2017 | Obradovic | .......... | H01L 29/7391 |
| 2002/0028541 A1* | 3/2002 | Lee | ..................... | G11C 16/3427 |
| | | | | 438/149 |

* cited by examiner

*Primary Examiner* — Cassandra F Cox
(74) *Attorney, Agent, or Firm* — Lee & Hayes, P.C.

(57) ABSTRACT

The field effect transistor (FET) of the present subject matter comprises a bottom gate electrode, a bottom gate dielectric provided on the bottom gate electrode, a channel layer provided on the bottom gate dielectric. A top portion comprising a source electrode, a drain electrode, a top gate electrode provided, and a top dielectric layer is provided on the channel layer. The channel layer forms Schottky barriers at points of contact with the source and the drain electrode. A back-gate voltage varies a height and a top-gate voltage varies a width of the Schottky barrier. The FET can be programmed to work in two operating modes-tunnelling (providing low power consumption) and thermionic mode (providing high performance). The FET can also be programmed to combine the tunnelling and thermionic mode in a single operating cycle, yielding high performance with low power consumption.

17 Claims, 6 Drawing Sheets

(51) Int. Cl.
*H01L 29/49* (2006.01)
*H01L 29/786* (2006.01)

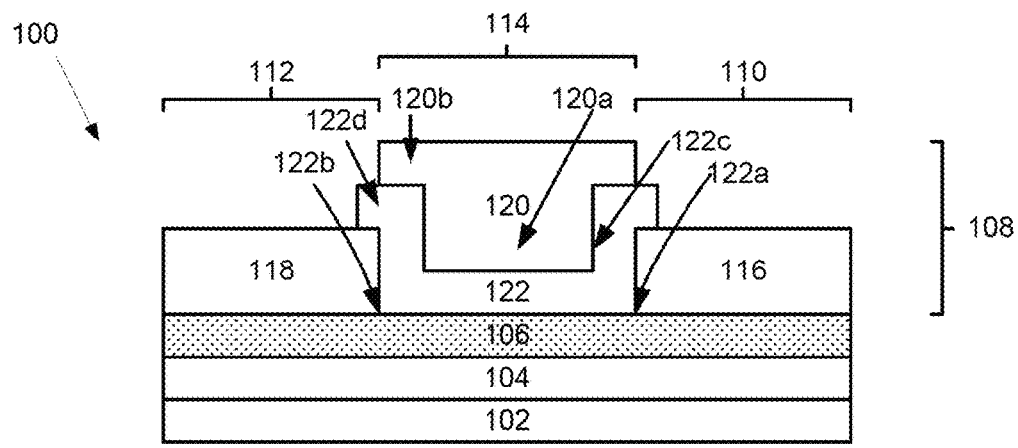
Fig. 1
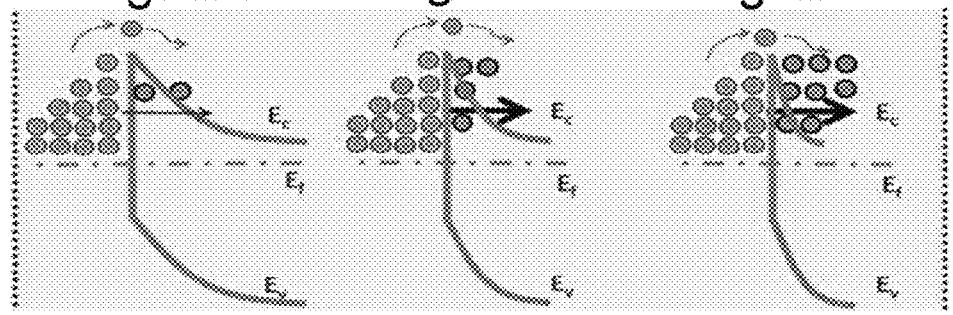
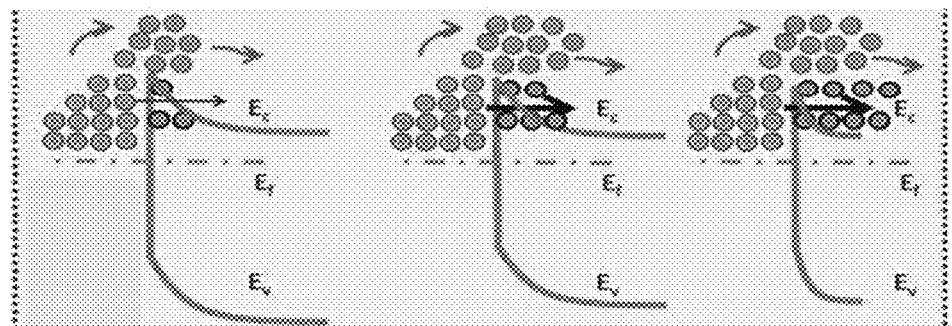

500

DETERMINING AN OPERATION MODE OF THE PROGRAMMABLE FET, WHEREIN THE OPERATION MODE IS ONE OF A THERMIONIC MODE OR TUNNELING MODE 502

APPLYING A BACK-GATE VOLTAGE TO A BOTTOM GATE ELECTRODE TO SWITCH BETWEEN THE THERMIONIC MODE AND THE TUNNELING MODE 504

APPLYING A TOP-GATE VOLTAGE TO A TOP GATE ELECTRODE TO CHANGE THE WORKING STATE OF THE FET 506

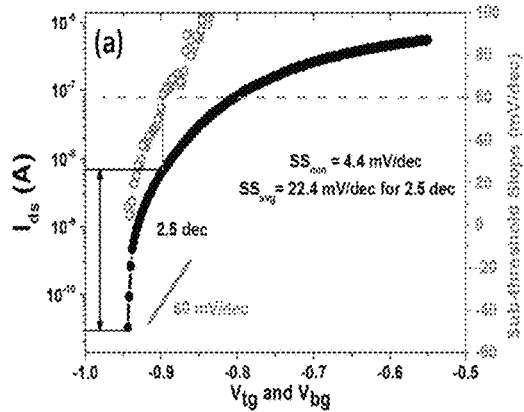 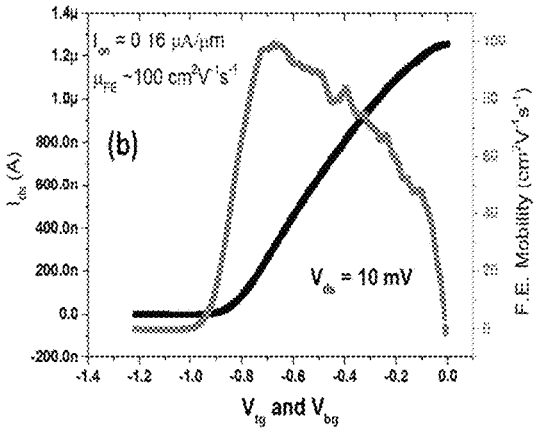
Fig. 11A  Fig. 11B
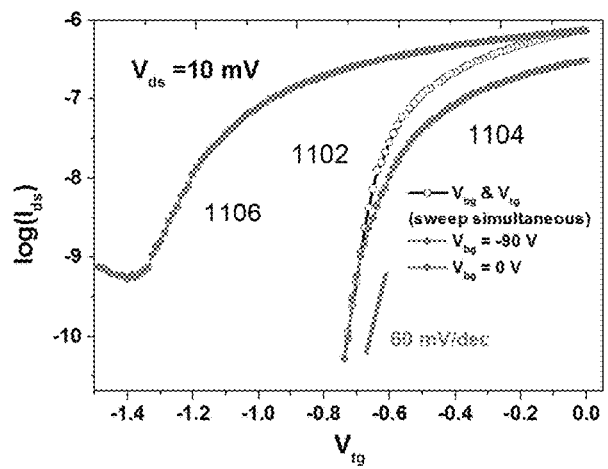
Fig. 12

PROGRAMMABLE TUNNEL THERMIONIC MODE TRANSISTOR

TECHNICAL FIELD

The present subject matter relates in general to semiconductor transistors, such as field effect transistors (FET), and in particular to programmable tunnel thermionic mode FET.

BACKGROUND

Low power metal oxide semiconductor field effect transistor (MOSFET) are used extensively in very large-scale integration (VLSI) circuit designs for commercial applications. Reduction in size of the FETs has resulted in packing of more transistors into the same footprint, thus, enhancing functionality. However, while size of FETs has reduced, supply voltage required for operation of the FETs has not reduced. Thereby, with the number of FETs increasing in the same footprint there is exponential increase in power consumption. Hence, to ensure ever-increasing functionality in VLSI along with environmental sustainability, it has become imperative to invent transistors with substantially reduced power consumption.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to reference like features and components.

FIG. 1 illustrates an example programmable Field Effect Transistor (FET), in accordance with an implementation of the present subject matter.

FIGS. 2A-2F depict the Schottky barrier of the example FET, in accordance with an implementation of the present subject matter.

FIGS. 11A and 11B show characteristics of the FET when the top-gate voltage and back-gate voltage are simultaneously varied, in accordance with an implementation of the present subject matter.

FIG. 12 illustrates the dual operating mode of the device, in accordance with an implementation of the present subject matter.

DETAILED DESCRIPTION

Figure 3:
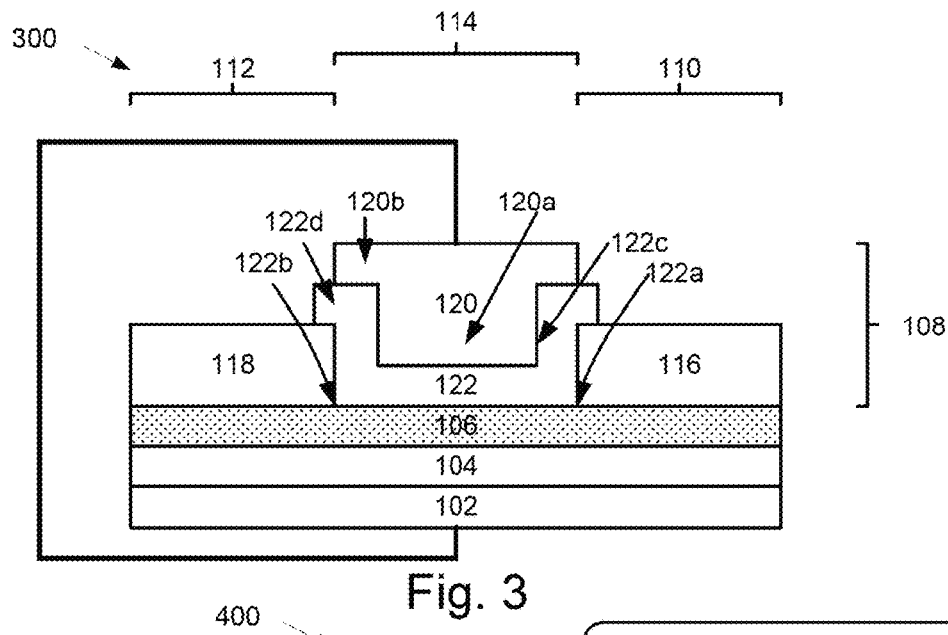
FIG. 3 depicts another example FET, in accordance with an implementation of the present subject matter.

The present subject matter relates to programmable thermionic tunnel field effect transistors.

One of the basic tenants of CMOS transistor scaling is that with reducing the dimensions of the transistor, one would be able to concurrently reduce the supply voltage ($V_{dd}$). Hence, scaling transistor dimensions also helps in reducing power consumption. Unfortunately, this trend has not been supported below the 100 nm channel length regime. While it has been possible to reduce channel dimension to 45-22 nm, reduction in supply voltage has plateaued off at around 1 V around channel dimensions of 65 nm. The supply voltage ($V_{dd}$) has, therefore, remained stagnant at 1 volt.

A transistor, as will be understood, is a switching device where on supply of a certain gate voltage, the transistor moves from OFF to ON and vice versa. Power consumption of a transistor is dependent on switching losses (from ON to OFF and vice versa) and leakage losses (when the transistors is OFF). Therefore, power consumption can be reduced by reducing the switching losses and the leakage losses. Power consumption due to switching losses has square law dependence on supply voltage ($V_{dd}$). Further, power consumption due to leakage losses is directly proportional to $V_{dd}$. Switching losses and leakage losses can, therefore, be reduced by reducing the $V_{dd}$.

Switching characteristics of transistors is dependent on the sub-threshold slope ($S_{s-th}$) which is as shown in Equation 1. The sub-threshold slope ($S_{s-th}$), as will be understood, is the gate voltage required to increase or decrease drain current of the transistor by one decade, and is therefore, measured in mV/dec. Therefore, a transistor characterized by steep sub-threshold slope requires a small gate voltage, and consequently lower supply voltage to facilitate a transition between off (low current) and on (high current) states and, therefore, has lower switching loss. Equation 1 as shown below describes the sub-threshold slope:

$$S_{s-th} = \ln(10)\frac{kT}{q}\left(1 + \frac{C_d}{C_{ox}}\right) \qquad \text{(eq. 1)}$$

A principal factor that has affected reducing the sub-threshold slope and, thereby, the supply voltage, is the Boltzmann limit. In Equation 1, since $(1+C_d/C_{ox})$ term, hereinafter also referred to as body factor, cannot be lower than 1. Hence, the sub-threshold swing of the thermionic transistor is fixed at $$\ln(10)\frac{kT}{q}$$

or 60 milliVolt/dec at room temperature of 300 K. This further causes a limit on the swing of current in subthreshold region and the MOSFET has a degraded OFF current.

The Boltzmann limit impacts the supply voltage and hence both static power consumption (leakage when transistor is OFF) and dynamic power consumption (switching power during transistor operation) as the number of transistors in the same footprint grows exponentially. Hence, the inability to reduce supply voltage has resulted in large energy requirements and heating and reliability issues. Considering at least 5 decades of drain current difference between ON and OFF state, and reasonable noise or reliability margins, the supply voltage for several generations of transistors has been stuck to ~1 V.

Research to circumvent the Boltzmann limit has progressed in two directions. First, efforts have been made to use ferroelectric material instead of insulating gate stacks. Ferroelectric material provides an unstable negative $C_{ox}$ instead of positive $C_{ox}$ as provided by the insulating gate stacks. This has been done to change value of $(1+C_d/C_{ox})$, also referred to as body factor, to less than 1 and hence, attain subthreshold swing (SS) less than 60 mV/dec. However, ferroelectric material switching times are orders of magnitude slower than gigahertz transistor switching speed of modern Complementary-MOSFETs. Further, there is also a large hysteresis loss while using ferroelectric material.

Second approach entails the migration of transistor conduction mechanism away from thermionic conduction to processes such as impact ionization and band to band tunneling (BTBT). Impact ionization technique requires very high electric fields and hence, drain voltages to induce ionised charge carriers. Therefore, it fails to offer SS<60 mV/dec for scaled voltages. Therefore, considering these limitations of impact ionizations, Tunnel FETs (T-FETs) which employ BTBT are being considered as most promising candidates to replace thermionic MOSFETs.

However, while the BTBT mechanism has enabled T-FETs to achieve very low OFF state currents and steep sub-threshold slope, it has resulted in heavily degraded ON state currents. Further, research in T-FETs based on traditional semiconductors, such as silicon, has not been able to demonstrate both large ON currents and steep sub-threshold slope in the same device. The requirement for low power transistor as specified by International Technology Roadmap for Semiconductors (ITRS) is one with average sub threshold slope <60 mV/dec for 4 decades of drain current along with high ON currents. Even the state of the art TFETs are unable to meet this requirement.

Furthermore, with increased functionality being introduced in the same SoC (System-On-Chip), transistors are to be operated in two regimes. In a first regime, the transistors are to be operated using reduced supply voltage with a steep sub-threshold slope and low OFF state currents to conserve power. In a second regime, for use in high-speed computations, transistors can compromise on OFF currents and sub-threshold slope but must offer very high ON state currents. Current CMOS technology offers no solution to combine both these regimes in the same device; hence they are created as two different physical entities.

The present subject matter provides a programmable Schottky barrier FET. The FET can be operated and switched between two operational modes, i.e., between a thermionic mode and a tunneling mode. In the tunneling mode, the FET achieves low OFF state currents and SS<60 mV/dec and in the thermionic mode, the FET achieves high ON state currents. In addition, the FET of the present subject matter can also be used to simultaneously achieve both SS<60 mV/dec and high ON state currents in the same operation cycle, which can be employed for scaled supply voltages and high frequency switching.

The programmable tunnel thermionic mode FET of the present subject matter is also referred to interchangeably as transistor or FET or programmable FET for ease of discussion. The FET of the present subject matter comprises a bottom gate electrode. A bottom gate dielectric is provided on the bottom gate electrode. A channel layer is provided on the bottom gate dielectric. The FET further comprises a first portion, a second portion, and an intermediate portion provided between the first portion and the second portion. The first portion comprises the source electrode and the second portion comprises the drain electrode.

The intermediate portion comprises a top gate electrode and a top dielectric layer. The top gate electrode is provided on the top dielectric layer. The top dielectric layer may extend partially to overlap the source electrode in the first portion and the drain electrode on the second portion. The top dielectric layer, the source electrode, and the drain electrode are provided on the channel layer.

The channel layer forms a Schottky barrier at points of contact with the source electrode and the drain electrode. In one example, a back-gate voltage can be applied to the bottom gate electrode for varying a height of the Schottky barrier and a top-gate voltage can be applied to the top gate electrode for varying a width of the Schottky barrier.

The FET of the present subject matter uses an asymmetric architecture for the two gates with respect to source and drain region. In particular, the bottom gate electrode is provided all along the channel layer, i.e., below the source electrode, in between the source electrode and the drain electrode, and below the drain electrode. In contrast, the top gate electrode is provided only in between the source electrode and the drain electrode. This configuration of the top gate electrode and the bottom gate electrode provide asymmetry to the FET of the present subject.

The top-gate voltage can help in selecting one of the two working states of the FET, namely, the ON state and the OFF state. In the ON state, the top-gate voltage ($V_{tg}$) is more than a threshold voltage ($V_{th}$). As will be understood, threshold voltage is the voltage applied between gate and source of a MOSFET that is needed to turn the device on for linear and saturation regions of operation. In the OFF state, the $V_{tg}$ is equal to or less than the $V_{th}$.

The bottom-gate voltage can help in selecting one of the two modes of operation of the FET, namely, the thermionic mode and the tunneling mode. As will be understood, in the thermionic mode, charge carriers move over or jump over the Schottky barrier and in the tunneling mode, charge carriers tunnel through the Schottky barrier.

In an example, the top-gate voltage and the back-gate voltage are varied simultaneously to switch the FET ON or OFF and to transition the FET from the tunneling mode to the thermionic mode. In said example, the top-gate voltage and the back-gate voltage are varied independently to obtain a sub-threshold swing of less than 60 millivolt per decade and high on current ($I_{on}$) within a single operating cycle.

Thus, the FET of the present subject matter is programmable to work in two configurations. In a first configuration, the back-gate voltage is fixed and the top-gate voltage is varied to change the mode of operation of the FET from the tunnelling mode (with sub-threshold slope less than 60 mV/dec) to the thermionic mode (with high ON current) and vice versa. In a second configuration, the top-gate voltage and the back-gate voltage are varied simultaneously to transition the tunneling mode to the thermionic mode, while simultaneously switching from OFF state to ON state, to obtain a sub-threshold swing of less than 60 millivolt per decade and high on current ($I_{on}$) in a single operating cycle. It to be understood that the FET is governed by the formation of Schottky contacts in the metal/semiconductor interface, in conjunction with asymmetric dual gate architecture, and hence is agnostic of channel material and channel length. Hence the FET of the present subject matter can be adapted for any channel length and is not limited to channel length below 100 nm.

The above and other features, aspects, and advantages of the subject matter will be better explained with regard to the following description and accompanying figures. It should be noted that the description and figures merely illustrate the principles of the present subject matter along with examples described herein and, should not be construed as a limitation to the present subject matter. It is thus understood that various arrangements may be devised that, although not explicitly described or shown herein, embody the principles of the present disclosure. Moreover, all statements herein reciting principles, aspects, and examples thereof, are intended to encompass equivalents thereof. Further, for the sake of simplicity, and without limitation, the same numbers are used throughout the drawings to reference like features and components.

FIG. 1 depicts an example programmable FET 100, in accordance with an implementation of the present subject matter. The FET 100 comprises a bottom gate electrode 102. In an example, the bottom gate electrode 102 is fabricated from metal, a doped semiconductor, and combinations thereof. In an example, the bottom gate electrode 102 is fabricated from a heavily doped p++ silicon. In an example, a thickness of the bottom gate electrode 102 is in a range of 0.5 nm to 500 nm. In an example, the thickness of the bottom gate electrode is 102 is 30 nm. In an example, the bottom gate electrode 102 is provided on a substrate, for example, a silicon substrate.

The FET 100 further comprises a bottom dielectric layer 104 provided on the bottom gate electrode 102. In an example, the bottom dielectric layer 118 is fabricated from insulators selected from the group consisting of silicon oxide, aluminium oxide, hafnium oxide and the like. In an example, a thickness of the bottom dielectric layer 118 is in a range of 0.3-300 nm, depending on specifics of transistor design. In an example, the thickness of the bottom dielectric layer 118 is 300 nm. A channel layer 106 is provided on the bottom dielectric layer 104.

In an example, the channel layer 106 is fabricated from Transition metal Di-chalcogenides (TMDCs) selected from the group consisting of molybdenum disulphide, hafnium disulphide, and tungsten diselenide. In an example, a thickness of the channel layer 106 is in a range of 1 nm-100 nm.

The FET 100 further comprises a top portion 108 provided on the channel layer 106. The top portion 106 comprises a first portion 110, a second portion 112, and an intermediate portion 114 provided between the first portion 110 and the second portion 112. The first portion 110 comprises a source electrode 116. In an example, the source electrode 116 is fabricated from metals. In an example, the metals may be selected from the group consisting of nickel, palladium, gold, and the like. In an example, the source electrode 116 and has a thickness in a range of 0.5 to 500 nm.

The second portion 112 comprises a drain electrode 118. In an example, the drain electrode 118 is fabricated from metals. In an example, the metals may be selected from the group consisting of nickel, palladium, gold, and the like. In an example, a thickness of the drain electrode 118 is in a range of 0.5 to 500 nm.

The intermediate portion 114 between the first portion 110 and the second portion 112 comprises a top gate electrode 120 and a top dielectric layer 122. The top gate electrode 120 may be substantially T-shaped and provided over the top dielectric layer 122. The top dielectric layer 122 may be substantially U-shaped with a stem 120a of the top-gate electrode 120 disposed in a groove 122c of the top dielectric layer 122. However, other configurations of the top dielectric layer 122 and the top gate electrode 120 are also possible. In an example, the top gate electrode 112 is fabricated from metals. In an example, the metals may be selected from the group consisting of nickel, palladium, gold, and the like and can have a thickness in a range of 0.5 to 500 nm.

In an example, arms 122d of the top dielectric layer 122 extend below flanges 120b of the top gate electrode 120. The top dielectric layer 122 partially overlaps the source electrode 116 in the first portion 110 and the drain electrode 118 in the second portion 112. In particular, arms 122d of the top dielectric layer 122 extend partially into the first portion 110 and the second portion 112. In an example, the top dielectric layer 122 is fabricated from insulators selected from the group consisting of hafnium oxide, aluminium oxide, and the like. The top dielectric layer 122 has a thickness in a range of 0.3-300 nm. In an example, the thickness of the top dielectric layer 122 is 30 nm.

The source electrode 116, the drain electrode 118, and the top dielectric layer 120 may be in contact with the channel layer 106. The channel layer 106 forms a Schottky barrier at points of contact with the source electrode 108 and the drain electrode 110. The Schottky barriers are formed in regions 122a, 122b. As will be understood, the Schottky barrier is a triangular electrostatic barrier, characterized with a height and a depletion width, hereinafter referred to as a width of the Schottky barrier, formed at the interface of a metal and a semiconductor.

The FET 100 is designed to independently control the height and the width of the Schottky barrier formed at the points of contacts between the channel layer 106 and each of the source electrode 116 and the drain electrode 118. A back-gate voltage ($V_{bg}$) applied to the bottom gate electrode 102 can be used to vary the height of the Schottky barrier and a top-gate voltage applied ($V_{tg}$) to the top gate electrode 120 can be used to vary the width of the Schottky barrier.

The top-gate voltage ($V_{tg}$) can help in selecting a working state of the FET. The working state may be one of ON and OFF. In the ON state, the top-gate voltage ($V_{tg}$) is more than a threshold voltage ($V_{th}$). As will be understood, threshold voltage is the voltage applied between gate and source of a MOSFET that is needed to turn the device on for linear and saturation regions of operation. In the OFF state, the $V_{tg}$ is lower than the $V_{th}$. Hence, the OFF state can also be called as sub-threshold state.

The bottom-gate voltage ($V_{bg}$) can help in selecting an operating mode of the FET. The operating mode may be one of a thermionic mode and a tunneling mode. As will be understood, in the thermionic mode, charge carriers move over or jump over the Schottky barrier and in the tunneling mode, charge carriers tunnel through the Schottky barrier.

To obtain better quality and reliability of Schottky barriers, the channel layer 106 may be surface treated, for example, by a sulphur based $(NH_3)_4S$ treatment, to engineer surface states with low contact resistance and variability. Further, in an example, the channel layer 106 may be doping free to achieve a steep sub-threshold slope (Equation 1). By making the channel layer 106 doping free, junctionless transistors with better process control can be developed. Furthermore, to reduce interface defects and traps between the top dielectric layer 122 and the channel layer 106, the top dielectric layer 122 may be made functionalization free by directly depositing the top dielectric layer 122 on the channel layer 116 using deposition techniques, such as e-beam physical vapor deposition (PVD). It is to be understood that other methods of deposition may also be used.

The thermionic mode is a function of the height of the Schottky barrier and the tunnelling mode component is a function of both the height and width of the Schottky barrier. Hence, by independently varying the height and width of the Schottky barrier, it is possible to switch between the tunnelling mode and the thermionic mode. This is further explained with respect to FIGS. 2A-2F.

FIGS. 2A-2F depicts the Schottky barrier below the source electrode 118, in accordance with an implementation of the present subject matter. FIGS. 2A-2F depicts a conceptual diagram of Schottky barrier where the height and the width of the Schottky barrier are controlled independently by the back-gate voltage and the top-gate voltage, respectively. As previously explained, by independently controlling the height and width, the FET can be tuned to work in the tunnelling mode and the thermionic mode interchangeably.

As shown in FIG. 2A, when the top-gate voltage is less than the threshold voltage, the FET 100 remains OFF, i.e., there is negligible movement of charge carriers. As the top-gate voltage increases close to or equal to the threshold voltage, as shown in FIG. 2B, the FET moves from OFF to ON, i.e., the charge carriers are mobilized. However, increase of top-gate voltage while reducing the width of the Schottky barrier, does not affect the height of the Schottky barrier. Therefore, the charge carriers tunnel through the Schottky barrier. As the top-gate voltage increases beyond the threshold voltage, the width of the Schottky barrier reduces, thereby, increasing tunnelling of the charge carriers through the Schottky barrier. Therefore, in the tunnelling mode, as illustrated diagrammatically in FIGS. 2A, 2B, and 2C, due to the height of the Schottky barrier, thermionic transport of the charge carriers is suppressed, therefore, sub-threshold slope is less than 60 mV/dec.

The height of the Schottky barrier may be independently controlled by the back-gate voltage. FIGS. 2D, 2E, and 2F depict variation in the height of the Schottky barrier with increase in the back-gate voltage. With the increase in the back-gate voltage, the height of the Schottky barrier is reduced. With the decrease in the height, transport of the charge carriers transitions from purely tunneling mode as shown in FIG. 2C to the thermionic mode as shown in FIG. 2F. Therefore, due to the lower height, the charge carriers tend to move over or jump over the Schottky barrier, thereby, the FET predominantly works in the thermionic mode. The thermionic mode is characterized by high ON currents.

Therefore, in the tunneling mode, large Schottky barrier height blocks thermionic transport of charge carriers and allows for only tunnelling transport, hence supporting SS<60 mV/dec. In the thermionic mode, small Schottky barrier height, allows for thermionic transport of the charge carriers, and hence providing high ON state currents.

In operation, with reference to FIG. 1 and FIGS. 2A-2F, the $V_{tg}$ is varied to switch the FET 100 from OFF to ON. By varying the $V_{tg}$, width of the FET 100 reduces, thereby, in the ON state, the charge carriers are transported by tunnelling transport. Further, to change the working state from the tunnelling mode to thermionic mode, the $V_{bg}$ is varied. By increasing the $V_{bg}$, the barrier height is reduced, thereby, to transitioning the FET 100 from tunnelling mode to thermionic mode. Therefore, in a first operating cycle, the FET 100 works in the tunnelling mode characterized by a sub-threshold swing of less than 60 mV/dec with degraded ON currents which may be used, for example, by peripheral computing components which do not require high switching speed but need to provide lower power consumption, and in a second operating cycle, the FET 100 works in the thermionic mode with high ON currents but a sub-threshold swing of 60 mV/dec or above which may be used, for example, in processors which require high switching speed.

In an example, the top-gate voltage and the back-gate voltage are varied simultaneously to switch the FET ON or OFF and to transition the FET from the tunneling mode to the thermionic mode. In said example, the top-gate voltage and the back-gate voltage are varied simultaneously to obtain a sub-threshold swing of less than 60 millivolt per decade and high on current ($I_{on}$) within a single operating cycle. FIG. 3 depicts yet another example FET 300 where the top-gate voltage and the back-gate voltage are varied simultaneously, in accordance with an implementation of the present subject matter.

In the example as shown in FET 300, the top gate electrode 120 and the bottom gate electrode 102 are electrically connected. Therefore, the top gate voltage and the back-gate voltage are varied simultaneously to obtain the sub-threshold swing of less than 60 millivolt per decade and high on current ($I_{on}$) in the same operating cycle. In operation, when the $V_{bg}$ and the $V_{tg}$ are increased simultaneously in the same operation cycle, the FET 300 is characterized by the sub-threshold swing of less than 60 millivolt per decade and high on current ($I_{on}$). As the FET 300 shows characteristics of both tunneling mode and thermionic mode, the mode of operation as shown in FET 300 is also referred to hereinafter as a hybrid configuration of operation.

Figure 4:
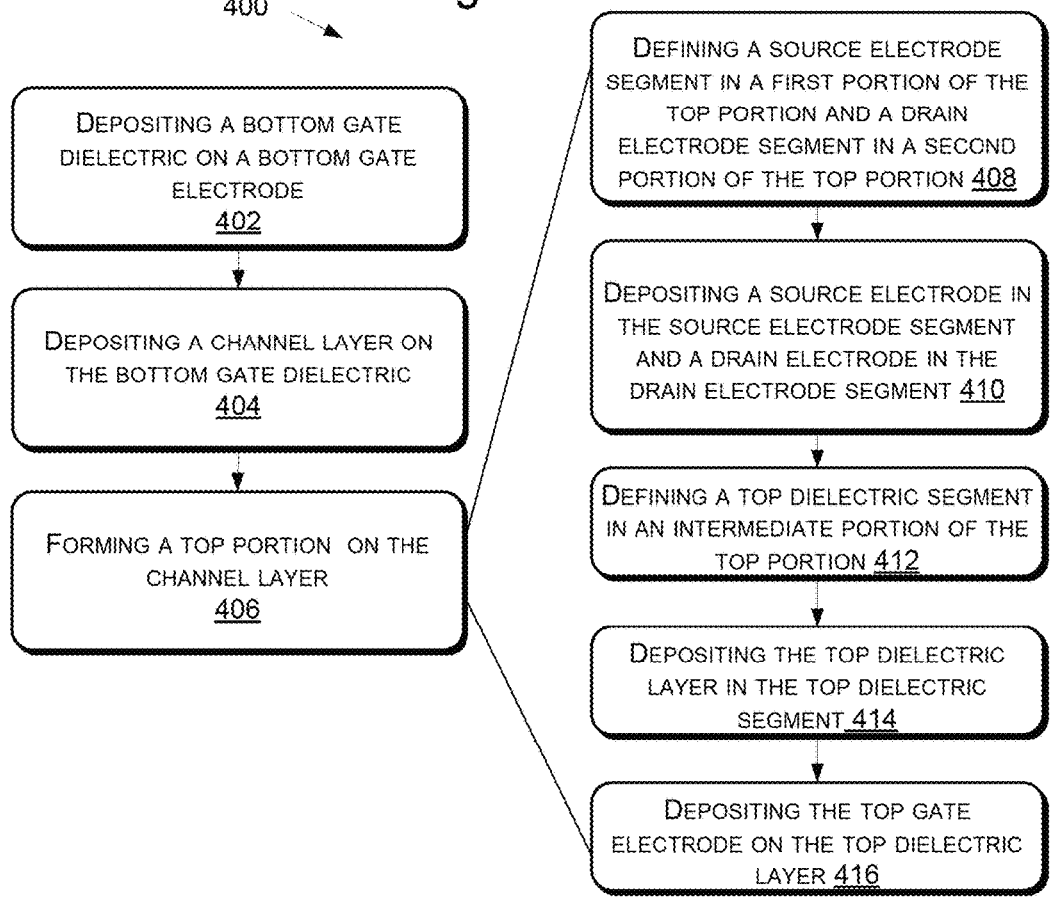
FIG. 4 depicts an example method for fabricating the programmable FET, in accordance with an implementation of the present subject matter.

The present subject matter further provides a method for fabricating a programmable field effect transistor (FET). In an example, the programmable FET is FET 100 as shown in FIG. 1 and FIG. 3. FIG. 4 illustrates an example method 400 for fabricating the programmable FET. At block 402, a bottom gate dielectric is deposited on a bottom gate electrode. In an example, the bottom gate dielectric 104 is deposited on the bottom gate electrode 102. In an example, the depositing is by chemical vapor deposition (CVD), physical vapor deposition (PVD), atomic layer deposition (ALD) and combinations, thereof.

At block 404, a channel layer is deposited on the bottom gate dielectric. In an example, the channel layer 106 is deposited on the bottom gate dielectric 104. In an example, the depositing is by chemical vapor deposition (CVD), physical vapor deposition (PVD), atomic layer deposition (ALD) and combinations, thereof.

At block 406, a top portion is formed on the channel layer. In an example, the top portion 108 is formed on the channel layer 106. At block 408, a source electrode segment is defined in a first portion of the top portion and a drain electrode segment in a second portion of the top portion. In an example, the first portion and the second portion are first portion 110 and the second portion 112 as shown in FIG. 1 and FIG. 3. In an example, the source electrode segment and the drain electrode segment are defined by lithography, wherein the lithography is photolithography, E-beam lithography, ion-beam lithography, neutral atomic beam lithography, X-ray lithography, interference lithography, soft lithography, and combinations thereof.

At block 410, a source electrode is deposited in the source electrode segment and a drain electrode is deposited in the drain electrode segment. A Schottky barrier is formed at points of contact of the channel layer with the source electrode and the drain electrode. In an example, the source electrode and the drain electrode are source electrode 110 and the drain electrode 112 as shown in FIG. 1 and FIG. 3.

In an example, the depositing is by chemical vapor deposition (CVD), physical vapor deposition (PVD), atomic layer deposition (ALD) and combinations, thereof.

At block 412, a top dielectric segment is defined in an intermediate portion of the top portion. The intermediate portion is between the first portion and the second portion. In an example, the intermediate portion is intermediate portion 114 as shown in FIG. 1 and FIG. 3. In an example, the source electrode segment and the drain electrode segment are defined by lithography, wherein the lithography is photolithography, E-beam lithography, ion-beam lithography, neutral atomic beam lithography, X-ray lithography, interference lithography, soft lithography, and combinations thereof.

At block 414, the top dielectric layer is deposited in the top dielectric segment. In an example, the top dielectric layer is top dielectric layer 122 as shown in FIG. 1 and FIG. 3. In an example, the depositing is by chemical vapor deposition (CVD), physical vapor deposition (PVD), atomic layer deposition (ALD) and combinations, thereof.

At block 416, the top gate electrode is deposited on the top dielectric layer. In an example, the depositing is by chemical vapor deposition (CVD), physical vapor deposition (PVD), atomic layer deposition (ALD) and combinations, thereof. A back-gate voltage applied to the bottom gate electrode is for varying a height of the Schottky barrier and wherein a top-gate voltage applied to the top gate electrode is for varying a width of the Schottky barrier.

Figures 5, 6:
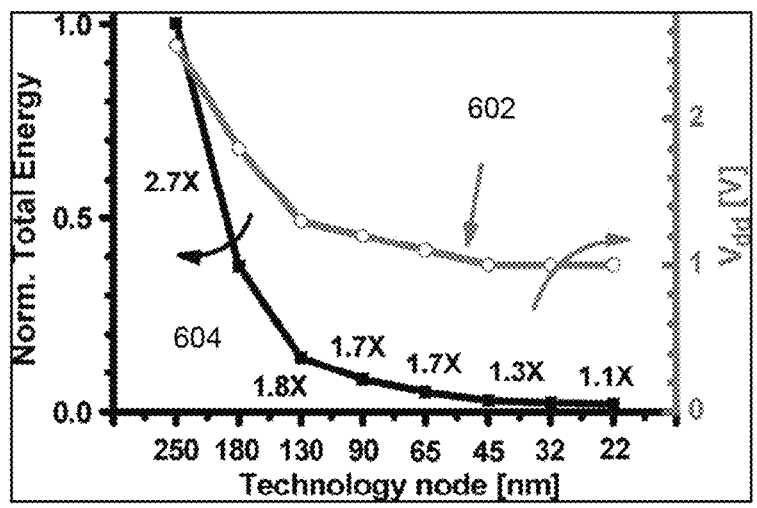
FIG. 5 depicts an example method of operating the programmable FET, in accordance with an implementation of the present subject matter.
FIG. 6 illustrates plot of energy dissipation with respect to geometric channel dimensions and supply voltage of operation of a conventional FET, in accordance with an implementation of the present subject matter.

FIG. 5 depicts an example method 500 of operating a FET in a programmable configuration, in accordance with an implementation of the present subject matter. In an example, the FET is FET 100 as shown in FIG. 1. At block 502, determining an operating mode of the programmable FET. The mode is one of the thermionic mode and the tunneling mode. At block 504, a back-gate voltage is applied to a bottom gate electrode to switch between the thermionic mode and the tunneling mode. In an example, the bottom gate electrode is bottom gate electrode 102 as shown in FIG. 1. In an example, for the thermionic mode, the back-gate voltage applied is higher than a flat band voltage and, for the tunneling mode, the back-gate voltage applied is lower than the flat band voltage. In an example, introducing thinner dielectrics at the bottom gate can further reduce the back-gate voltage and the top-gate voltage.

FIG. 5 depicts operation of a FET in the programmable configuration. However, in another example, the FET may be operated in a hybrid configuration. In said example, the FET may be FET 300. To operate the FET in the hybrid configuration, a common back-gate voltage and top-gate voltage may be applied to obtain a tunneling mode in OFF state and a thermionic mode in ON state in a single operating cycle.

At block 506, a top-gate voltage is applied to a top gate electrode to change a working state of the programmable FET from ON to OFF and vice versa. In an example, to change the working state to ON, the top-gate voltage is increased more than a threshold voltage and, to change the working state to OFF, the top-gate voltage is decreases more than the threshold voltage.

The present subject matter will now be illustrated with working examples, which are intended to illustrate the working of disclosure and not intended to be taken restrictively to imply any limitations on the scope of the present disclosure. Unless defined otherwise, all technical and scientific terms used herein have the same meaning as commonly understood to one of ordinary skill in the art to which this disclosure belongs. It is to be understood that this disclosure is not limited to the particular methods and experimental conditions described, as such methods and conditions may vary depending on the process and inputs used as will be easily understood by a person skilled in the art.

EXAMPLES

Example 1

Stagnation of Supply Voltage

FIG. 6 illustrates plot of energy dissipation with respect to geometric channel dimensions and power supply voltage of operation of a conventional FET. FIG. 6 depicts effect of two components, namely, channel dimensions (line 602) and supply voltage (line 604), on power loss reduction. As shown by line 602, it has been possible to reduce channel dimensions from to as low as 22 nm. Further, this has resulted in reduction of power loss. However, as seen by line 604, it has not been possible to reduce the supply voltage and the same has plateaued off at substantially 1 V around reduced channel dimension of 65 nm.

Example 2

Independent Control of Height and Width of Schottky Barrier

Figures 7A, 7B, 7C:
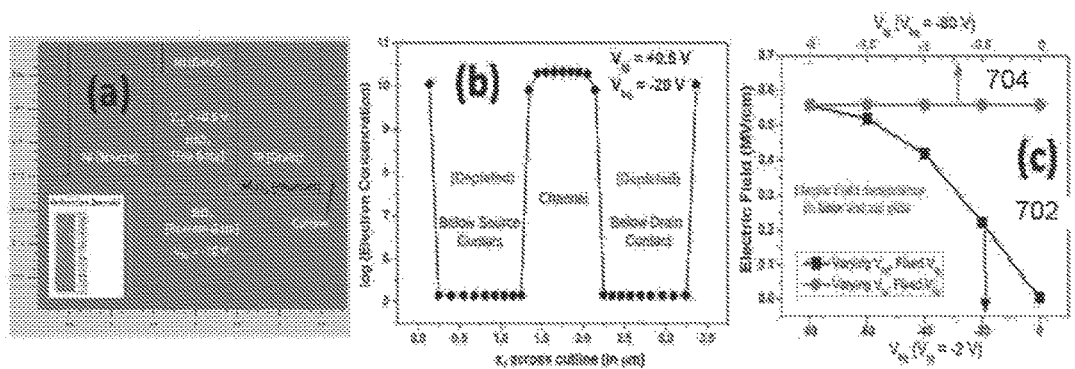
FIGS. 7A-7C show device simulations which demonstrate that the Schottky barrier height, in accordance with an implementation of the present subject matter.

FIGS. 7A-7C show the independent controls that result from operating the asymmetric dual gates during the switching regime of the device, in accordance with an implementation of the present subject matter. Further, FIGS. 7A-7B also depicts device simulations which demonstrate that the Schottky barrier height is controlled by the back-gate voltage. FIG. 7A illustrates electrostatic modelling by solving the Poisson's equation in the FEM (Finite Element Method)-meshed device geometry. FIG. 7B depicts the electron concentration along the midsection cutline on the $MoS_2$ channel. FIG. 7B also demonstrates depleted channel below the contacts controlled by the bottom-gate and populated channel controlled by the top-gate. FIG. 7C illustrates influence of channel electric field under contact region under different top-gate (line 704) and back-gate (line 702) sub-threshold conditions. Unlike $V_{bg}$ increase, $V_{tg}$ has no impact on channel electric-fields below the contact region, furthering evidence of contact areas controlled exclusively by $V_{bg}$. In effect, the height of the Schottky barrier can be controlled by back-gate voltage. The top gate voltage controls the width of the Schottky barrier. The independent control of the height and the width by the back-gate voltage and the top-gate voltage was subsequently realized to transition from the tunnelling mode to the thermionic mode.

Example 3

Varying Height of Schottky Barrier

Figure 8:
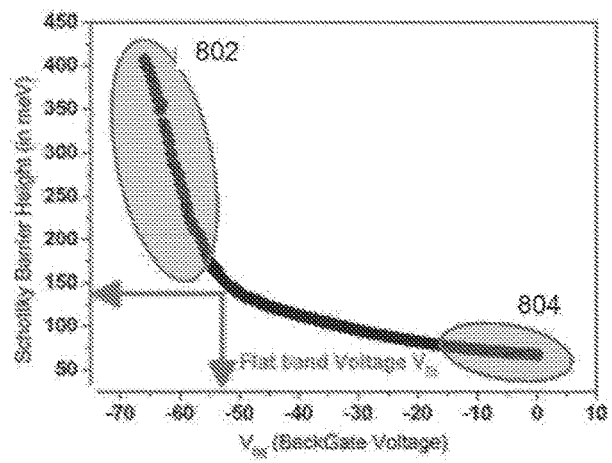
FIG. 8 shows the characteristics of the bottom gate controlling the barrier height, in accordance with an implementation of the present subject matter.

FIG. 8 shows the control characteristics of the back-gate voltage controlling the height of the Schottky barrier, in accordance with an implementation of the present subject matter. With increase in $V_{bg}$ barrier height drops rapidly till the onset flat band voltage ($V_{fb}$) beyond which the barrier height attains a slowly decaying constant value. Point 802, which corresponds to large Schottky Barrier height can be realized by keeping $V_{bg} \ll V_{fb}$ and Point 804 can be realized for $V_{bg} > V_{fb}$.

Example 3

Switching Between Tunnelling Mode and Thermionic Mode

Figure 9:
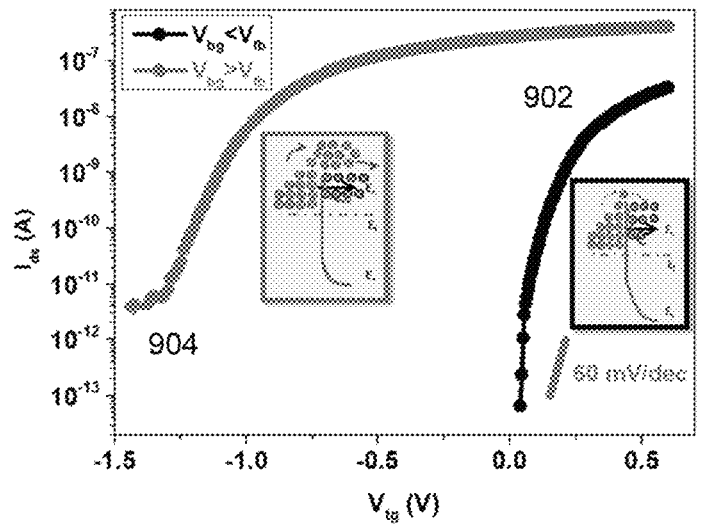
FIG. 9 illustrates the experimental results demonstrating tunability of this device from tunnelling mode to thermionic mode, in accordance with an implementation of the present subject matter.

FIG. 9 illustrates the tunability of this device from tunnel mode to thermionic mode during switching to realize SS<60 my/decade, in accordance with an implementation of the present subject matter. As illustrated in FIG. 9, Line 902 corresponds to point 802 as shown in FIG. 8 where $V_{bg}<V_{fb}$ results in tunnelling transport with SS<60 mV/dec. As illustrated in Line 904 which corresponds to Line 804 where $V_{bg}>V_{fb}$, there is predominantly thermionic transport, and SS is no longer less than 60 mV/dec, but demonstrating significantly larger ON currents.

Figure 10:
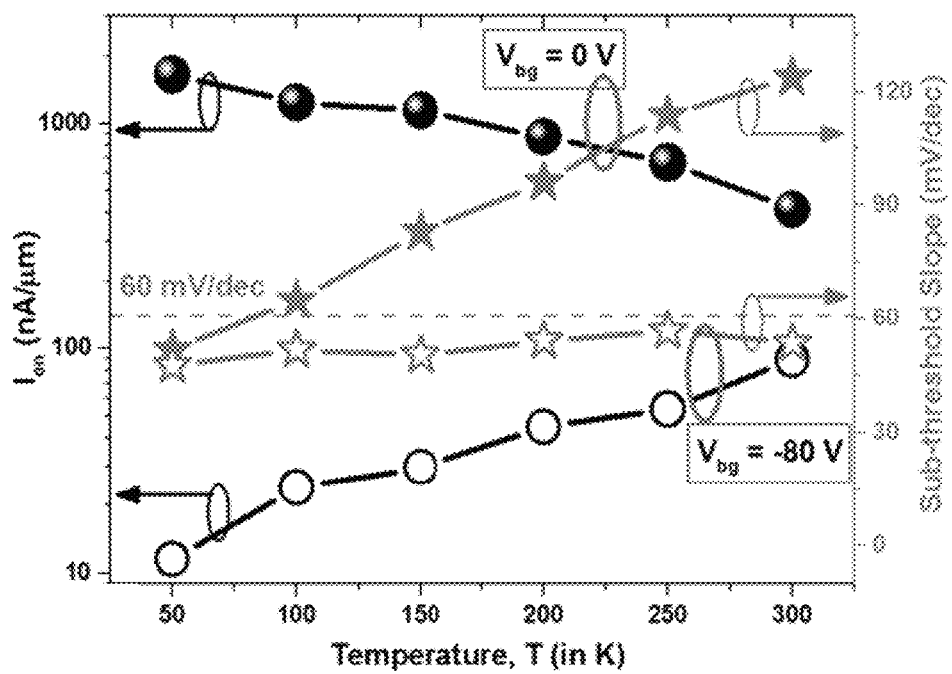
FIG. 10 demonstrates tuning of the device from tunnelling mode to thermionic mode from the back-gate comparing the $I_{on}$ (ON currents) and sub-threshold Slope (SS) with temperature, in accordance with an implementation of the present subject matter.

FIG. 10 demonstrates tuning of the device from tunnel mode to thermionic mode from the back-gate comparing the $I_{on}$ (ON currents) and sub-threshold Slope (SS) with temperature. FIG. 10 illustrates the temperature dependent characteristics of the SS and ON currents realized by the FET 100 for both thermionic and tunnel modes. As described earlier for $V_{bg}<V_{fb}$ (corresponding to point 802 in FIG. 8) the FET 100 operates in the tunnelling mode which is characterised with temperature invariant SS and ON currents increasing with temperature. In contrast $V_{bg}<V_{fb}$ (corresponding to point 804 in FIG. 8), the FET 100 operates in thermionic mode which is characterised with SS directly proportional to temperature. Further, in the thermionic mode, ON currents reduce with temperature. Thus, during the tunnelling mode of operation the SS can be maintained below the 60 mV/decade threshold and thus enabling energy efficient switching. On the other hand, in the thermionic mode the FET 100 provides high ON currents.

Example 4

Simultaneous Varying of Top-Gate Voltage and Bottom Gate Voltage

FIGS. 11A and 11B show the device characteristics when the top-gate voltage and back-gate voltage are simultaneously varied. In this mode, the top gate electrode and the bottom gate electrode are connected to a single potential. Simultaneous sweep of $V_{tg}$ and $V_{bg}$ translates to very steep SS and ON currents/mobility due to the simultaneous reduction in Schottky barrier height and width. FIG. 12 depicts yet another graph depicting FET characteristics when there is simultaneous sweep of $V_{tg}$ and $V_{bg}$. As can be seen by line 1102 which indicates the simultaneous sweep of $V_{tg}$ and $V_{bg}$, characteristic of line 1102 lies in between that of tunneling mode indicated by line 1104 and thermionic mode as indicated by line 1106. Therefore, when the $V_{tg}$ and $V_{bg}$ are varied simultaneously, the FET the sub-threshold slope was found to be less than 60 mV/dec while providing high ON current. Therefore, within the same operating cycle, the FET can provide advantages of tunneling mode (sub-threshold slope less than 60 mV/dec) and thermionic mode (high $I_{on}$). Further, as can be seen from FIGS. 11A and 11B, the average sub threshold slope for line 1102 was found to be 37.5 mV/dec for over 4 decades. Therefore, the FET 100 of the present subject matter is a true low power FET in accordance with International Technology Roadmap for Semiconductors (ITRS).

The present subject matter can be implemented with standard top-down semiconductor processing, thus making it compatible with modern CMOS processing. Further, it can also be implemented on layered semiconductors such as transition metal di-chalcogenides (TMDCs) or any ultra-thin body semiconductors including vertical transistor architectures, such as, FinFETs. The FET of the present subject matter can also be fabricated to be flexible or bendable. The present subject matter is essentially governed by the formation of Schottky contacts in the metal/semiconductor interface, in conjunction with asymmetric dual gate architecture and hence is agnostic of channel material and channel length.

Although the subject matter has been described in considerable detail with reference to certain examples and implementations thereof, other implementations are possible. As such, the scope of the present subject matter should not be limited to the description of the preferred examples and implementations contained therein.

We claim:

1. A programmable field effect transistor (FET) comprising:
   a bottom gate electrode;
   a bottom gate dielectric provided on the bottom gate electrode;
   a channel layer provided on the bottom gate dielectric; and
   a top portion provided on the channel layer, wherein the top portion comprises:
      a first portion comprising a source electrode;
      a second portion comprising a drain electrode; and
      an intermediate portion between the first portion and the second portion, wherein the intermediate portion comprises:
         a top gate electrode; and
         a top dielectric layer, wherein the top gate electrode is provided on the top dielectric layer,
      wherein the channel layer forms a Schottky barrier at points of contact with the source electrode and the drain electrode,
      wherein a back-gate voltage applied to the bottom gate electrode is for varying a height of the Schottky barrier and for switching the FET between a thermionic mode and a tunneling mode, wherein both modes are operated in the channel layer, and
      wherein a top-gate voltage applied to the top gate electrode is for varying a width of the Schottky barrier.

2. The programmable FET as claimed in claim 1, wherein the top-gate voltage is for switching the FET between two working states, wherein the working state is one of ON state and OFF state.

3. The programmable FET as claimed in claim 1, wherein the top-gate voltage and the back-gate voltage are varied independently, wherein the tunneling mode has a sub-threshold swing of less than 60 millivolt per decade, and the thermionic mode has high on current ($I_{on}$).

4. The programmable FET as claimed in claim 1, wherein the top-gate voltage and the back-gate voltage are varied simultaneously to obtain a sub-threshold swing of less than 60 millivolt per decade and high on current ($I_{on}$), in a single operating cycle.

5. The programmable FET as claimed in claim 1, wherein the top gate electrode and top gate dielectric layer extend to partially overlap the source electrode in the first portion and the drain electrode in the second portion.

6. The programmable FET as claimed in claim 1, wherein the top-gate electrode is fabricated from metals, wherein the metals are selected from the group consisting of nickel, palladium, gold, and combinations thereof, and wherein the top-gate electrode has a thickness in the range of 0.5-500 nm.

7. The programmable FET as claimed in claim 1, wherein the top-dielectric layer is fabricated from insulators selected from the group consisting of hafnia ($HfO_2$) and alumina ($Al_2O_3$) and wherein the top-dielectric layer has a thickness in the range of 0.3-300 nm.

8. The programmable FET as claimed in claim 1, wherein the source electrode and the drain electrode are fabricated from metals, wherein the metals are selected from the group consisting of nickel, palladium, gold, and combinations thereof, and wherein each of the source electrode and the drain electrode have a thickness in the range of 0.-500 nm.

9. The programmable FET as claimed in claim 1, wherein the channel layer is fabricated from an ultra-thin body semiconductor.

10. The programmable FET as claimed in claim 1, wherein the bottom-gate electrode is fabricated from any metal and wherein the bottom-gate electrode has a thickness in the range of 0.5-500 nm.

11. The programmable FET as claimed in claim 1, wherein the bottom-dielectric layer is fabricated from an insulator and wherein the bottom-dielectric layer has a thickness in the range of 0.3-300 nm.

12. A method for fabricating a programmable field effect transistor (FET) comprising:
   depositing a bottom gate dielectric on a bottom gate electrode;
   depositing a channel layer on the bottom gate dielectric;
   forming a top portion on the channel layer, wherein forming the top portion comprises:
      defining a source electrode segment in a first portion of the top portion and a drain electrode segment in a second portion of the top portion;
      depositing a source electrode in the source electrode segment and a drain electrode in the drain electrode segment, wherein a Schottky barrier is formed at points of contact of the channel layer with the source electrode and the drain electrode;
      defining a top dielectric segment in an intermediate portion of the top portion, wherein the intermediate portion is between the first portion and the second portion;
      depositing the top dielectric layer in the top dielectric segment; and
      depositing the top gate electrode on the top dielectric layer,
   wherein a back-gate voltage applied to the bottom gate electrode is for varying a height of the Schottky barrier and for switching the FET between a thermionic mode and a tunneling mode, wherein both modes are operated in the channel layer, and
   wherein a top-gate voltage applied to the top gate electrode is for varying a width of the Schottky barrier.

13. The method as claimed in claim 12, wherein the depositing is by one of: chemical vapor deposition (CVD), physical vapor deposition (PVD), atomic layer deposition (ALD) and combinations thereof.

14. The method as claimed in claim 12, wherein the defining is by lithography, wherein the lithography is one of: photolithography, E-beam lithography, ion-beam lithography, neutral atomic beam lithography, X-ray lithography, interference lithography, soft lithography, and combinations thereof.

15. A method of operating a field effect transistor (FET) in a programmable configuration, the method comprising:
   determining an operating mode of the programmable FET, wherein the mode is one of a thermionic mode and a tunneling mode;
   applying a back-gate voltage to a bottom gate electrode to switch between the thermionic mode and the tunneling mode, wherein both modes are operated in the same channel layer; and
   applying a top-gate voltage to a top gate electrode to change a working state of the programmable FET.

16. The method as claimed in claim 15, wherein the method comprises:
   applying the back-gate voltage higher than a flat band voltage for the thermionic mode; and
   applying the back-gate voltage lower than the flat band voltage for the tunneling mode.

17. A method of operating a field effect transistor (FET) in a hybrid configuration, the method comprising: applying a common back-gate voltage and top-gate voltage for the hybrid mode to obtain a tunneling mode in OFF state and a thermionic mode in ON state in a single operating cycle, wherein both modes are operated in the same channel layer.

* * * * *